United States Patent [19]

Byun

[11] Patent Number: 5,604,140

[45] Date of Patent: Feb. 18, 1997

[54] METHOD FOR FORMING FINE TITANIUM NITRIDE FILM AND METHOD FOR FABRICATING SEMICONDUCTOR ELEMENT USING THE SAME

[75] Inventor: Jeong S. Byun, Chungcheongbuk-do, Rep. of Korea

[73] Assignee: LG Semicon, Co. Ltd., Cheongju, Rep. of Korea

[21] Appl. No.: 443,570

[22] Filed: May 22, 1995

[51] Int. Cl.$^6$ .................. H01L 21/283; H01L 21/336
[52] U.S. Cl. .............. 437/41; 437/60; 437/190; 437/192; 437/200
[58] Field of Search ................ 437/190, 192, 437/193, 189, 200, 52, 60, 41 GS

[56] References Cited

U.S. PATENT DOCUMENTS

| | | | |
|---|---|---|---|
| 4,887,146 | 12/1989 | Hinode | 357/71 |
| 4,990,997 | 2/1991 | Nishida | 357/71 |
| 5,162,262 | 11/1992 | Ajika et al. | 437/200 |
| 5,164,333 | 11/1992 | Schwalke et al. | 437/200 |
| 5,236,868 | 8/1993 | Nulman | 437/190 |
| 5,378,660 | 1/1995 | Ngan et al. | 437/247 |
| 5,420,070 | 5/1995 | Matsuura et al. | 437/190 |

*Primary Examiner*—T. N. Quach
*Attorney, Agent, or Firm*—Alan R. Loudermilk

[57] ABSTRACT

A method for forming a fine titanium nitride film and a method for fabricating a semiconductor element using this method. The method for forming a fine titanium nitride film includes the steps of depositing a titanium nitride film on a semiconductor substrate such as with a reactive sputtering method, introducing oxygen into the columnar structured grain boundaries of the titanium nitride film such as by exposing the titanium nitride film to atmosphere, depositing a titanium film on the titanium nitride film having oxygen stuffed therein, converting the titanium film into a fine titanium nitride film by subjecting the titanium film to two times of a heat treatment process. In case a COB DRAM element bit line is formed of tungsten, the fine titanium nitride film and the underlying oxygen-stuffed titanium nitride film, serving as barriers for preventing high temperature diffusion of the tungsten, allow a tungsten bit line having excellent contact and barrier properties. In case the fine titanium nitride film is used as an MOS transistor gate, a gate which can satisfy the thermal stability of a polysilicon as well as the low resistivity of a silicide may be obtained.

17 Claims, 11 Drawing Sheets

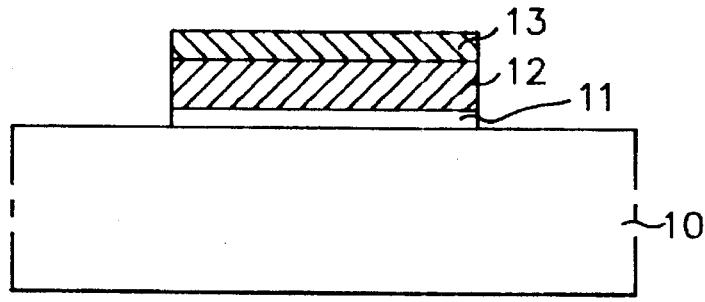
FIG. IA
PRIOR ART
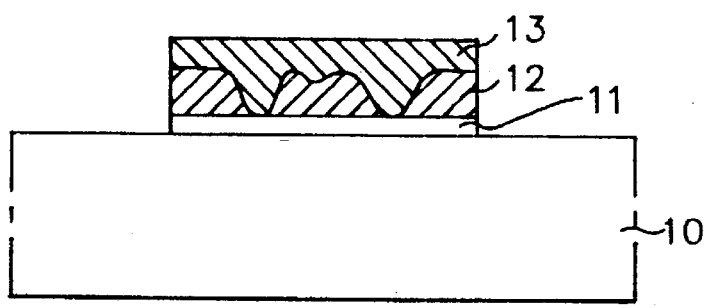
FIG. IB
PRIOR ART
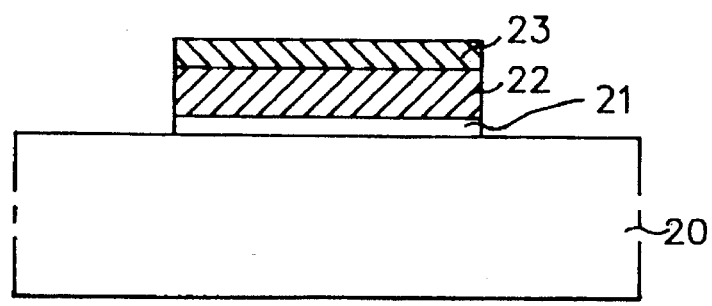
FIG. 2A
PRIOR ART
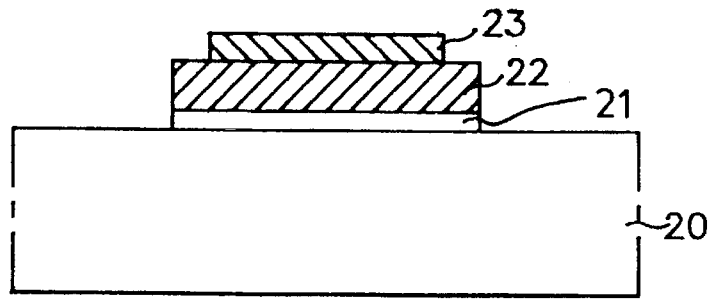
FIG. 2B
PRIOR ART

METHOD FOR FORMING FINE TITANIUM NITRIDE FILM AND METHOD FOR FABRICATING SEMICONDUCTOR ELEMENT USING THE SAME

FIELD OF THE INVENTION

This invention relates to methods for forming titanium nitride films having a low resistivity, and more particularly to a method for forming a fine titanium nitride film which is suitable as a diffusion barrier layer between a metal layer of, such as, tungsten, and a silicon substrate, and a method for fabricating a semiconductor element using this method.

BACKGROUND OF THE INVENTION

As the design rule for elements in products such as dynamic random access memories (DRAMs) becomes more stringent, a greater restraint has been imposed on using materials having high resistivity, such as polycrystalline silicon as a gate electrode of the elements. In order to overcome this restraint, many studies for lowering the resistivity of the gate electrode have been carried out.

First, metals, such as tungsten or molybdenum, having a low reactivity with a gate oxide film of, such as, a silicon oxide film, have been investigated for use as the gate electrode. Second, a silicide film of, such as, tantalum silicide $TaSi_2$ or molybdenum silicide $MoSi_2$, deposited on the gate oxide film also have been investigated for use as the gate electrode. These methods, however, have problems in that the properties of the gate oxide film may deteriorate and/or the material of the gate electrode may peel off of the gate oxide film by the reaction of the gate oxide film with the gate electrode. Particularly, in case of a ultra-large scale integrated element having a gate oxide film of several tens of angstroms (Å) in thickness, the element can suffer from radiation damage. That is, the stability of the polycrystalline film sometimes cannot be assured with the foregoing methods.

Third, polycides having resistivities as low as the above metals and silicides, as well as stabilities as stable as the polycrystalline silicon film, have been investigated for use as the gate electrode. As for methods for forming the polycides, there is a self-aligned silicide (salicide) method using a chemical vapor deposition (CVD) method or with a sputtering method.

FIGS. 1A and 1B are sectional views illustrating a semiconductor element illustrating a conventional polycide film formed with the salicide method.

Referring to FIG. 1A, a gate oxide film and a layered gate electrode have been formed by forming thin oxide film 11 and polycrystalline silicon film 12 on silicon substrate 10, and by forming polycide film 13 thereon with the salicide method, and subjecting these layers to a patterning.

However, in case the polycide film is formed on a polycrystalline silicon film with the salicide method, the interface between polycrystalline silicon film 12 and polycide film 13 making up the gate electrode is unstable. As a result, problems of agglomeration and penetration of polycide 13 into underlying polycrystalline film 12 may occur as illustrated in FIG. 1B due to a subsequent heat treatment process.

FIGS. 2A and 2B are sectional views of a semiconductor element illustrating a conventional polycide film formed with a CVD method or a sputtering method.

As illustrated in FIG. 2A, in the case of a layered gate electrode having layers of polycrystalline film 22 and polycide film 23 formed on gate oxide film 21 on substrate 20, with the layers formed with a CVD method or a sputtering method, steps may form between polycrystalline silicon film 22 and polycide 23 of the gate electrode and/or polycide film 23 may peel off from polycrystalline silicon film 22 due to shrinkage of polycide film 23 in a subsequent heat treatment process due to the instability of the interface between polycrystalline silicon film 22 and polycide film 23. Moreover, in case the polycide film is used as the gate electrode of an ultra-large scale integrated element on the order of 0.1 μm, there has been a limit in using such a polycide film as a gate electrode due to a sharp increase of the resistivity.

Fourth, a titanium nitride film formed with a reactive sputtering method has been investigated for use as an inactive gate electrode.

As illustrated in FIG. 3A, in case titanium nitride film 32 is used as the gate electrode, the ultra-large scale integrated element having very thin gate oxide film 31 on substrate 30 can suffer from radiation damage. Moreover, the properties of titanium nitride film 32 deposited with a sputtering method may be altered due to immigration of impurities 34 along the grain boundaries between columns of the columnar structured titanium nitride film in a subsequent heat treatment process as illustrated in FIG. 3B.

When the Gibbs free energies of the titanium oxide film and the silicon oxide film are compared, since the energy of the titanium oxide film is substantially greater than the energy of the silicon oxide film, titanium nitride film 32 may react with gate oxide film 31 of silicon oxide in a subsequent heat treatment process. Therefore, a problem may occur in that the gate oxide film is spoiled due to reaction of the titanium nitride film of the gate electrode with the gate oxide film to be altered into a titanium oxide film and a titanium silicide.

Fifth, a composite silicide film has been investigated for use as the gate electrode.

As illustrated in FIG. 4, in order to solve the problem of the third method wherein the polycide film is used as the gate electrode, a composite polycide structured gate electrode is formed by depositing both titanium nitride film 43 on polycrystalline silicon film 42 as a barrier and titanium silicide $TiSi_2$ film 44 thereon. Reference numbers 40 and 41 in the drawing represent a silicon substrate and a gate oxide film, respectively. However, since the method also utilizes a sputtering method in forming the titanium silicide, like the previous case, the problems of shrinkage and contamination by impurities of the silicide have been caused in a subsequent heat treatment process.

FIG. 5 is a sectional view of a general COB (Capacitor On Bit line) structured DRAM element having bit lines formed of polycide.

Referring to FIG. 5, in general, the conventional COB structured DRAM element has used polycide, for example, tungsten silicide $WSi_2$/polycrystalline silicon films 52 and 51, as bit lines. In case the bit lines are formed of polycide, though advantageous in terms of excellent thermal stability, such may have a problem of low operation speed of the element due to the high resistivity of the tungsten silicide film being about 50~200 μΩ·cm and the resistivity of the polycrystalline silicon film being about 200 μΩ·cm.

Moreover, the polycrystalline silicon film of the bit line doped with n+ type impurities can form a contact only to n+ type or n− type region 53 or 54. Therefore, in order to form a contact for capacitor 57 to a bit line to p+ type region 55 in a final wiring process, a poor process of etching insulation film 59 at a portion having an aspect ratio of more than 3 should have been carried out.

That is, in case wiring 56-2 and 56-1 are formed with contacts to n+ type region 53 and p+ type region 55, respectively, a contact to region 53 having a substantially smaller aspect ratio than the contact to p+ type region 55 can be formed due to a bit line formed of polycrystalline silicon film 51 and tungsten silicide film 52 on n+ type region 53.

At this time, in case the bit line is formed of a metal, the process can be simple since the bit line can be formed irrespective of the conduction type of the impurity region, but, as illustrated in FIG. 5, in case the bit line is formed of a polycrystalline silicon film, there has been a problem in that the processes are substantially complicated and difficult, since a contact to p+ type region 55 having a much greater aspect ratio may be required.

Moreover, the thermal processes for fabricating the COB structured DRAM element performed at an elevated temperature of over 800° C. repeated several times after the processes for forming gate electrodes 58 and the bit lines is equivalent to a process performed under an elevated temperature such as about 870° C. for 9 hours.

Therefore, an effective barrier layer that can inhibit reaction of the bit line metal with the silicon substrate is required in case a metal like tungsten is used as the bit line material.

Referring to FIG. 6A, for the conventional COB structured DRAM element, titanium nitride and titanium films 63 and 62 have been used as a barrier layer for preventing high temperature diffusion of the bit line tungsten.

That is, in order to prevent diffusion of the bit line tungsten in the processes performed under elevated temperatures after the formation of tungsten bit line 64, a barrier layer formed of titanium nitride and titanium films 63 and 62 has been formed between bit line 64 and silicon substrate 60. Reference number 61 in the drawing is a thick insulation film formed of an oxide film.

However, as has been explained, since the titanium nitride film has a columnar structure with many voids, the barrier layer formed of the titanium nitride film/titanium film can be spoiled as illustrated in FIG. 6B.

Therefore, there has been a problem in that the element can be spoiled due to reaction of the tungsten with the substrate through the spoiled barrier to form tungsten silicide 65.

Moreover, there has been a problem in that the resistivity of the foregoing titanium nitride film deposited with the reactive sputtering method becomes very high (up to about 200–1000 $\mu\Omega\cdot cm$) due to the grain structure illustrated in FIG. 3B, compared to a resistivity of about 23 $\mu\Omega\cdot cm$ of a single crystal titanium nitride film at room temperature.

SUMMARY OF THE INVENTION

An object of this invention is to provide a fine structured titanium nitride film with a thermal nitridation process.

Other objects of this invention include providing a method for forming a fine titanium nitride film having low resistivity as well as excellent thermal stability.

Another object of this invention is to provide a fine titanium nitride film suitable for a barrier that can prevent high temperature diffusion of a bit line metal.

A further object of this invention is to provide a method for fabricating an MOS transistor utilizing the method for forming a fine titanium nitride film.

A still further object of this invention is to provide a method for fabricating a COB structured DRAM element utilizing the method for forming a fine titanium nitride film.

These and other objects and features of this invention may be achieved by providing a method for forming a fine titanium nitride film, including steps for depositing a titanium nitride film on a semiconductor substrate with a reactive sputtering method, stuffing oxygen into columnar structured grain boundaries of the titanium nitride film by exposing the titanium nitride film to atmosphere, depositing a titanium film on the titanium nitride film having oxygen stuffed therein, converting the titanium film into a fine titanium nitride film by subjecting the titanium film to two times of a heat treatment process.

These and other objects and features of this invention may be achieved by providing a method for fabricating a semiconductor element, including steps for forming a gate oxide film on a semiconductor substrate, forming a polysilicon film on the gate oxide film, depositing a titanium nitride film on the polysilicon film, stuffing oxygen into grain boundaries of the titanium nitride film by exposing the titanium nitride film to atmosphere, depositing a titanium film on the titanium nitride film, converting the titanium film into a fine titanium nitride film by subjecting the titanium film to rapid thermal annealing, forming a gate by subjecting the fine titanium nitride film and the underlying titanium nitride film to patterning successively, and forming impurity regions in the substrate by subjecting the substrate to second conduction type impurity ion injection with the gate used as a mask.

These and other objects and features of this invention may be achieved by providing a method for fabricating a semiconductor element, including steps for forming a second conduction type impurity region in a first conduction type semiconductor substrate, forming an insulation film on the semiconductor substrate having the impurity region formed therein, forming a contact hole to the impurity region by removing a part of the insulation film on the impurity region, depositing a first titanium film on the overall substrate and stuffing oxygen into grain boundaries of the first titanium film by exposing the first titanium film to atmosphere, depositing a titanium nitride film on the first titanium film and exposing the titanium nitride film to atmosphere, depositing a second titanium film on the titanium nitride film, converting the second titanium film into a fine titanium nitride film by subjecting the second titanium film to rapid thermal annealing, forming a bit line metal layer on the titanium nitride film, forming a bit line so as to make contact to the impurity region through the contact hole by subjecting the titanium nitride film and the metal layer to patterning successively, and forming a capacitor by carrying out a general capacitor forming process.

As such, in case the fine titanium nitride film is utilized as an MOS transistor gate, a gate satisfying the thermal stability of a polysilicon film as well as the low resistivity of a silicide can be obtained.

As such, in case a COB DRAM element bit line is formed of tungsten, a tungsten bit line having excellent contact properties as well as barrier properties can be obtained because the fine titanium nitride film and the underlying oxygen stuffed titanium nitride film serve as barriers that can prevent high temperature diffusion of the tungsten in following capacitor forming process.

BRIEF DESCRIPTION OF THE DRAWINGS

The above objects and other advantages of the present invention will become more apparent by describing in detail the preferred embodiments of the present invention with reference to the attached drawings in which:

FIG. 1A is a sectional view illustrating a semiconductor element having a gate of polycide formed by a conventional salicide method.

FIG. 1B is a sectional view illustrating the semiconductor element of FIG. 1A after subjecting it to a heat treatment.

FIG. 2A is a sectional view illustrating a semiconductor element having a gate of polycide formed by a conventional chemical vapor deposition method or a sputtering method.

FIG. 2B is a sectional view illustrating the semiconductor element of FIG. 2A after subjecting it to a heat treatment.

FIGS. 6A and 6B illustrate sections of a COB DRAM element where a titanium nitride film and titanium film are used as barrier layers in a conventional tungsten bit line process, wherein FIG. 6A illustrates the structure before heat treatment, and FIG. 6B illustrates the structure after heat treatment.

DETAILED DESCRIPTION OF THE INVENTION

A method for forming a fine titanium nitride film in accordance with a first embodiment of this invention and processes for fabricating a semiconductor element utilizing the method are to be explained hereinafter, referring to the attached drawings.

FIGS. 7A to 7D illustrate processes for forming the fine titanium nitride film in accordance with the first embodiment of this invention.

Figure 7A:
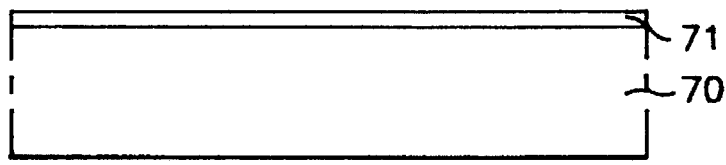
FIGS. 7A to 7D illustrate processes for forming a fine titanium nitride film in accordance with a first embodiment of this invention.
Figure 7B:
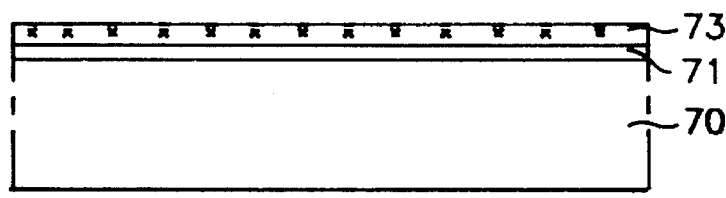

Referring to FIGS. 7A and 7B, thin oxide film 71 is formed on silicon substrate 70, and titanium nitride film 72 is formed thereon to a thickness of about 50–500 Å with a reactive sputtering method. After forming titanium nitride film 72 with a reactive sputtering method, the wafer is exposed to atmosphere. That is, titanium nitride film 72 is exposed to atmosphere containing oxygen.

Titanium nitride film 72 exposed to atmosphere absorbs oxygen to stuff oxygen into (or introduce into) the grain boundaries of the titanium nitride film. Therefore, due to the oxygen stuffed in the voids between the grain boundaries of the titanium nitride film, transfer of material through the voids of the titanium nitride film is inhibited. Thus, the titanium nitride film stuffed with oxygen can serve as a good diffusion barrier.

Figure 7C:
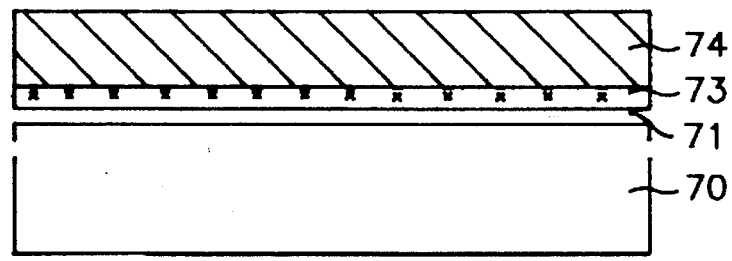
Figure 7D:
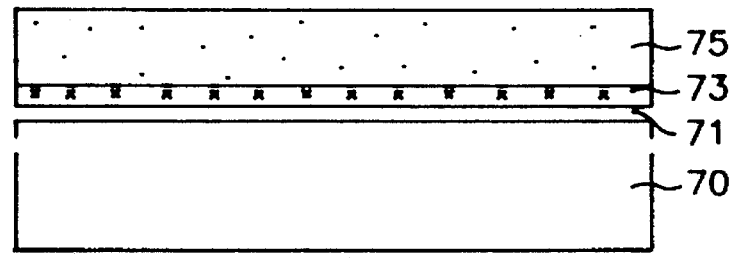

Titanium film 73 is formed on titanium nitride film 72 to a thickness of about 200–2000 Å as illustrated in FIG. 7C, and is subjected to nitridation with more than one time of rapid thermal annealing. As a result, the titanium film can be converted into fine titanium nitride film 74 as illustrated in FIG. 7D. As an example, it has been determined that nitridation resulting in nitrogen atoms in the titanium film of an amount of up to or below about 40% may give good results.

Titanium nitride film 72 stuffed with oxygen, serving as a diffusion barrier inhibiting reaction between titanium film 73 and substrate 70, can prevent underlying thin oxide film 71 from being spoiled.

Of the two (or more) times of rapid thermal annealing done in this invention, the first one may be conducted at about 500° C. for about 40 seconds and the second one may be conducted at about 800° C. for about 30 seconds.

Figure 12:
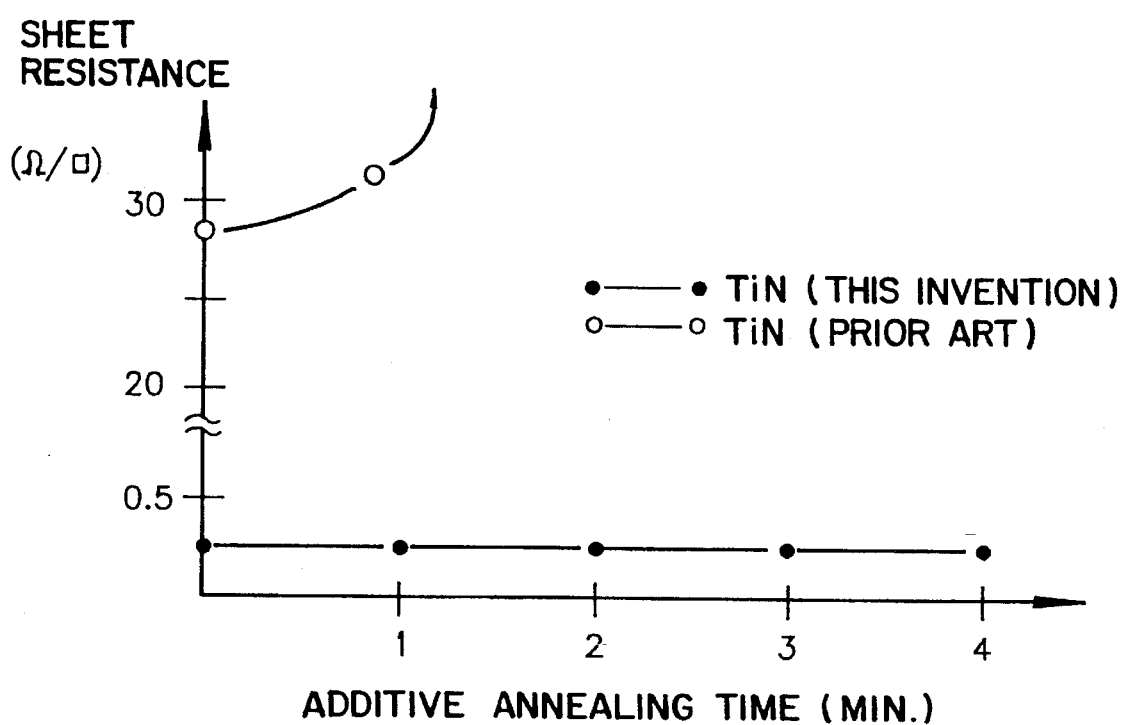
FIG. 12 is a graph illustrating sheet resistivities of the fine titanium nitride films formed by this invention and the conventional invention after heat treatment.

Properties of the conventional titanium nitride film having the grain boundaries stuffed with no oxygen formed by a reactive sputtering method and the fine titanium nitride film in accordance with this invention are illustrated in FIG. 12.

As illustrated in FIG. 12, in case two titanium nitride films each having a thickness of about 1000 Å are subjected to rapid thermal annealing at about 650° C. for about 30 seconds for comparison of the two titanium nitride films, the fine titanium nitride film obtained through the foregoing processes exhibits an almost constant sheet resistivity of about 0.3 $\Omega/\square$ irrespective of the duration of the heat treatment with a resistivity of about 30 $\mu\Omega$·cm, whereas, compared to this invention, the conventional titanium nitride film deposited by a reactive sputtering method exhibits a substantially greater sheet resistivity of about 28 $\Omega/\square$ with a resistivity of about 280 $\mu\Omega$·cm.

As a result of additional heat treatment done with a varied duration at a temperature of about 950° C. in order to investigate thermal stability of fine titanium nitride film 74 in accordance with this invention, it is found that sheet resistivity Rs of the fine titanium nitride film in accordance with this invention is almost constant irrespective of the duration of the heat treatment, whereas it is found that the conventional titanium nitride film exhibits spoiling of the element at the moment when the duration of the additional heat treatment exceeds one minute due to a sharp increase of the sheet resistivity to a significantly greater value.

Accordingly, it has been found that the fine titanium nitride film in accordance with this invention can satisfy the thermal stability of a polycide as well as the low resistivity of a silicide.

Even though the foregoing embodiment has been explained based on a titanium film and a titanium nitride film, it is evident that the embodiment of this invention may be applicable not limited to the above, but also may be applicable to refractory metals including IVB (Ti, Zr, and Hf) and VB (V, Nb, and Ta) groups of the transition metals of the periodic table.

FIGS. 8A to 8H illustrate processes for fabricating an MOS transistor utilizing the method for forming a fine titanium nitride film of FIGS. 7A and 7D, having a gate thereof formed of the fine titanium nitride film.

Figure 8A:
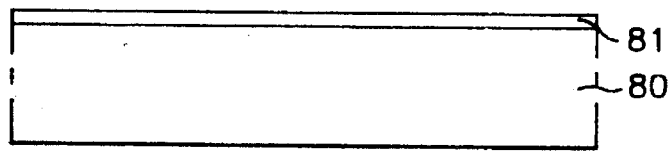
FIGS. 8A to 8H illustrate processes for fabricating a semiconductor element using the method for forming a fine titanium nitride film of FIGS. 7A and 7D.
Figure 8B:
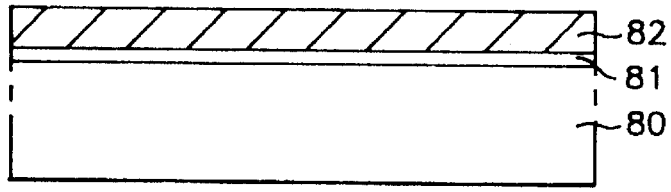

Referring to FIGS. 8A and 8B, thin gate oxide film 81 having a thickness of about 80 Å is formed on silicon substrate 80, and doped polysilicon film 82 having a thickness of about 500 Å is deposited thereon.

Figure 8C:
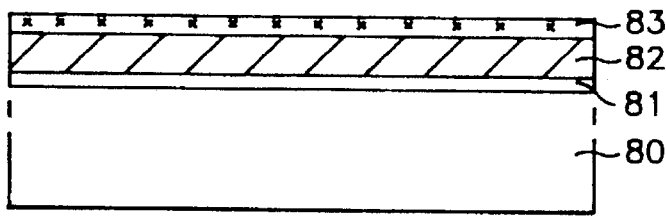

Referring to FIG. 8C, titanium nitride film 83 is deposited to a thickness of about 100 Å with a reactive sputtering method, and the wafer is exposed to atmosphere. That is, titanium nitride film 83 is exposed to atmosphere. At this time, grain boundaries of titanium nitride film 83 exposed to atmosphere are stuffed with oxygen.

Figure 8D:
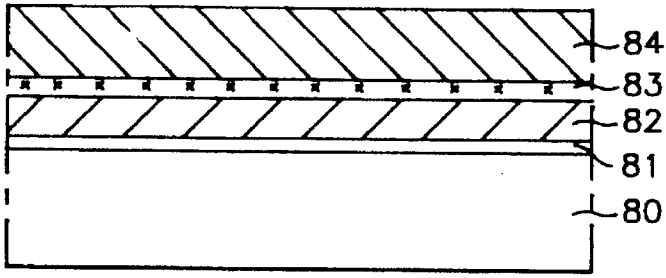
Figure 8E:
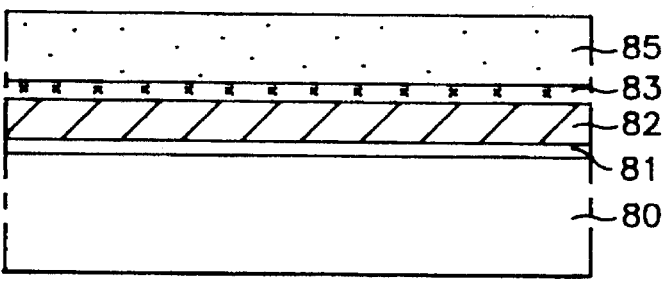

As illustrated in FIG. 8D, by depositing titanium film 84 on titanium nitride film 83 to a thickness of about 1000 Å, and by subjecting them to nitridation/rapid thermal annealing as above as illustrated in FIG. 8E, fine titanium nitride film 85 can be formed.

Figure 8F:
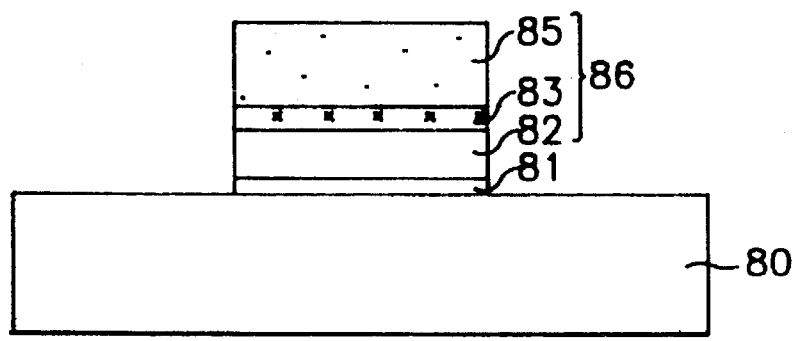

As illustrated in FIG. 8F, by subjecting fine titanium nitride film 85, underlying oxygen-stuffed titanium nitride film 83, and polysilicon film 82 to patterning, gate 86 made up of fine titanium nitride film 85, oxygen stuffed titanium nitride film 83, and polysilicon film 82 can be formed.

Figure 8G:
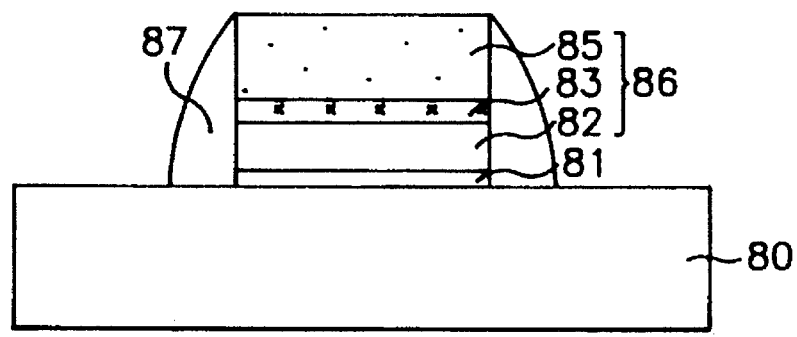
Figure 8H:
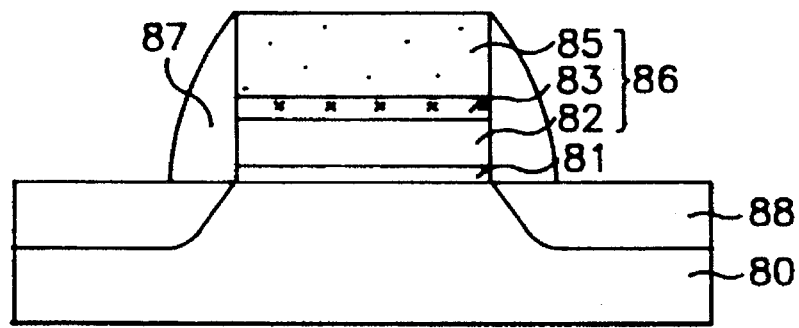

As illustrated in FIG. 8G and 8H, by forming side wall spacers 87 at the sides of gate 86, and by injecting impurities having a conductivity opposite to substrate 80 into substrate 80 with gate 86 and side wall spacers 87 used as masks, impurity regions 88 for the source/drain regions are formed. Thus, an MOS transistor having the fine titanium nitride film utilized as a gate can be fabricated. At this time, since the fine titanium nitride film utilized as a gate has a sheet resistivity of about 3 $\Omega/\square$, a good gate electrode can be formed.

Figure 9A:
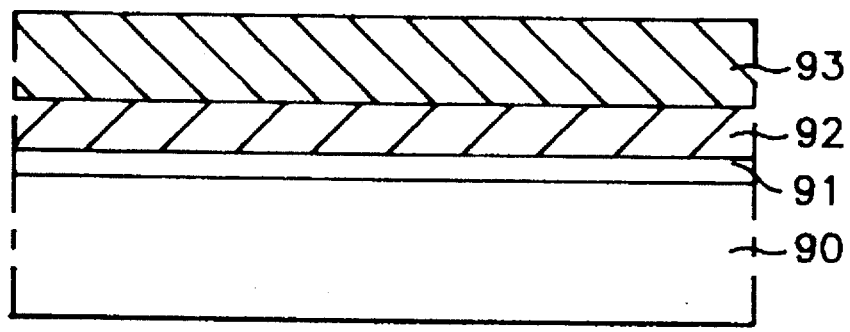
FIGS. 9A and 9B illustrate processes for forming a fine titanium nitride film in accordance with a second embodiment of this invention.
Figure 9B:
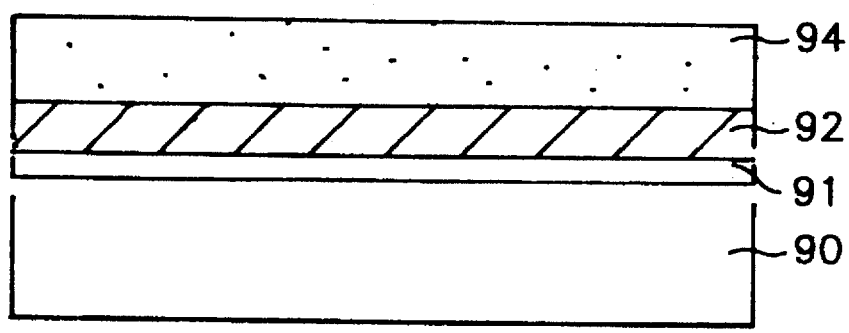

FIGS. 9A and 9B illustrate processes for forming a fine titanium nitride film in accordance with a second embodiment of this invention.

Referring to FIG. 9A, titanium film 91, titanium nitride film 92, and titanium film 93 are deposited on silicon substrate 90, successively. At this time, overlying titanium film 93, titanium nitride film 92, and underlying titanium film 91 are deposited to thicknesses of about 200–2000 Å, about 50–500 Å, and below about 200 Å, respectively.

Titanium film 91, titanium nitride film 92, and titanium film 93 are not deposited on substrate 90 continuously, but are exposed to atmosphere after deposition of each of the films in order to stuff the grain boundaries with oxygen. That is, on finishing deposition of underlying titanium film 91, titanium film 91 is exposed to atmosphere, on finishing deposition of titanium nitride film 92, titanium nitride film 92 is exposed to atmosphere, and thereafter overlying titanium film 93 is deposited. Thus, titanium nitride film 92 stuffed with oxygen can serve as a good diffusion barrier.

As illustrated in FIG. 9B, upon nitridation of overlying titanium film 93 by subjecting it to more than one time of rapid thermal annealing, titanium film 93 is converted into fine titanium nitride film 94. Underlying titanium film 91, converted into a titanium silicide $TiSi_2$ film through reaction with substrate 90, forms an ohmic contact to improve the contact properties.

Titanium nitride film 92 stuffed with oxygen serving as a diffusion barrier isolates the reaction between overlying titanium film 93 and underlying titanium film 91.

Of the two times of rapid thermal annealing also performed in the second embodiment of this invention, the first one may be conducted at about 500° C. for about 40 seconds and the second one may be conducted at about 800° C. for about 30 seconds.

Like the first embodiment of this invention, it is found that the fine titanium nitride film in accordance with the second embodiment of this invention has the properties as illustrated in FIG. 12.

Even though the second embodiment has been explained based on a titanium film and a titanium nitride film, it is evident that the embodiment of this invention may be applicable not limited to the above, but also may be applicable to refractory metals including IVB (Ti, Zr, and Hf) and VB (V, Nb, and Ta) groups of the transition metals of the periodic table.

FIGS. 10A to 10E illustrate processes for fabricating a DRAM element utilizing the method for forming a fine titanium nitride film of FIGS. 9A and 9B.

Figure 10A:
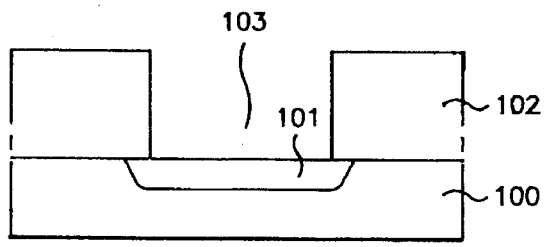
FIGS. 10A to 10E illustrate processes for fabricating a semiconductor element using the method for forming a fine titanium nitride film of FIGS. 9A and 9B.
Figure 10B:
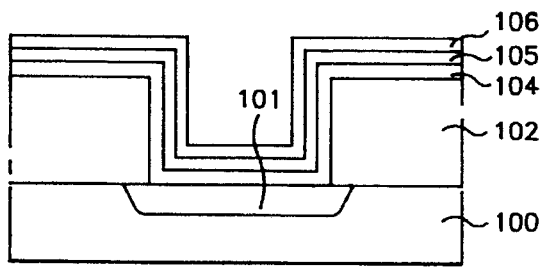

Referring to FIG. 10A, impurity region 101 is formed in silicon substrate 100, and thick oxide film 102 is deposited on substrate 100 having impurity region 101 formed therein to a thickness of about 5000 Å. Bit line contact 103 to impurity region 101 is formed by etching oxide film 102 on impurity region 101.

Titanium film 104, titanium nitride film 105, and titanium film 106 are deposited on the overall substrate including bit line contact 103 to thicknesses of below about 400 Å, about 100 Å, and about 100 Å, respectively.

Titanium film 104, titanium nitride film 105, and titanium film 100 are not deposited on substrate 100 continuously, but are exposed to atmosphere after deposition of each of the films in order to stuff the grain boundaries with oxygen.

Figure 10C:
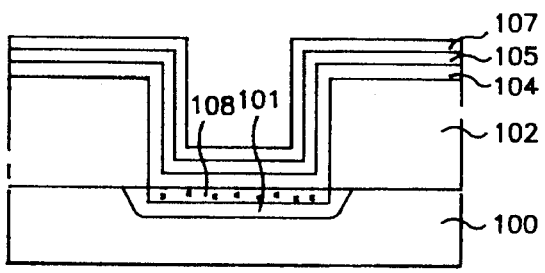

As illustrated in FIG. 10C, upon nitridation of overlying titanium film 106 by subjecting it to more than one time of rapid thermal annealing, titanium film 106 is converted into fine titanium nitride film 107.

Of underlying titanium film 104, the part in contact with substrate 100 converts into titanium silicide $TiSi_2$ film 108 through reaction with silicon of substrate 100 and forms an ohmic contact to improve the contact properties. Since titanium film 104 in contact with oxide film 102 does not react with the oxide film, titanium film 104 remains otherwise in a substantially unaltered form.

Titanium nitride film 105 stuffed with oxygen serving as a diffusion barrier isolates the reaction between overlying titanium film 106 and underlying titanium film 104.

Of the two times of rapid thermal annealing conducted, the first one may be conducted at about 500° C. for about 40 seconds and the second one may be conducted at about 800° C. for about 30 seconds.

Figure 10D:
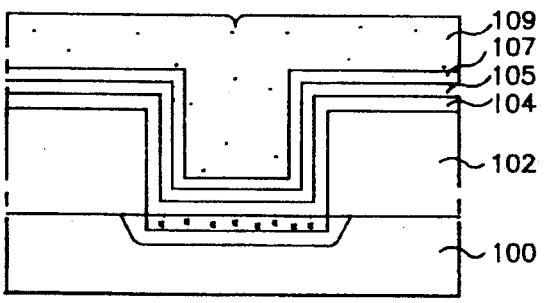
Figure 10E:
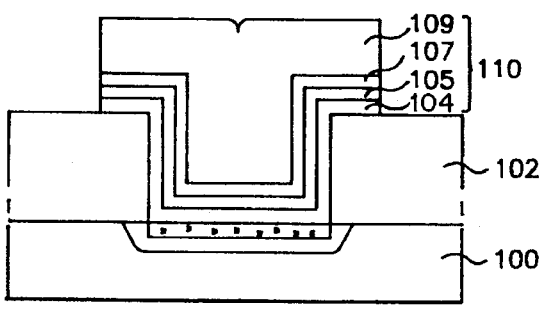

Referring to FIGS. 10D and 10E, bit line 110 is formed by depositing tungsten film 109 to a thickness of about 1000 Å with a chemical vapor deposition method, and subjecting tungsten film 109, fine titanium nitride film 107, oxygen stuffed titanium nitride film 105, and titanium film 104 to a patterning.

After forming the bit line, a COB-structured DRAM element may be fabricated by carrying out a capacitor forming process.

Figure 6A:
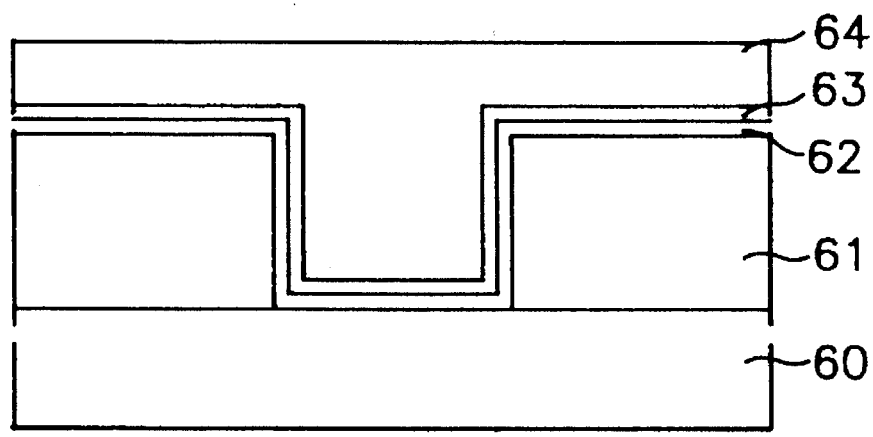
Figure 6B:
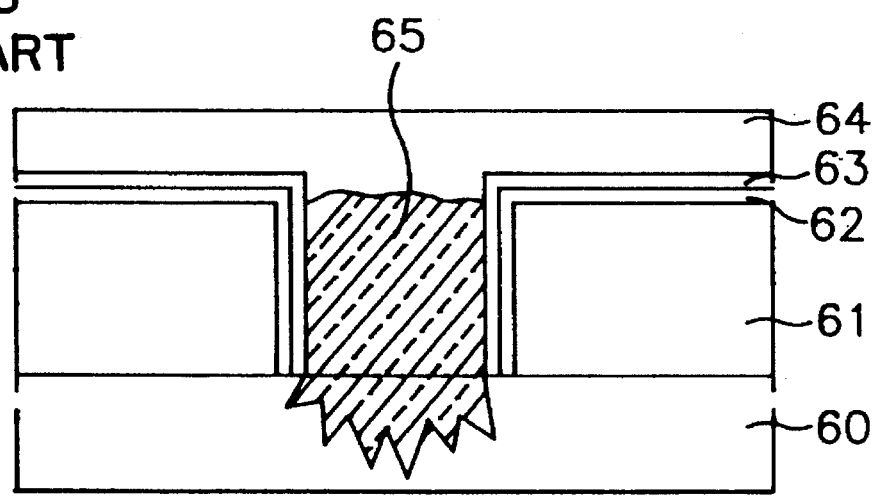

Though the fabrication process for forming the COB structured DRAM element after formation of the bit line is equivalent to carrying out a heat treatment process at about 870° C. for about 9 hours, prevention of diffusion of the tungsten even in such high temperature conditions may be achieved by the excellent barrier properties of fine titanium nitride film 107, oxygen stuffed titanium nitride film 105, and titanium film 104. That is, tungsten diffusion through the barrier as illustrated in FIG. 6B may not occur. It also has an effect that the sheet resistivity is not changed even after the additional heat treatment process as illustrated in FIG. 12.

Figure 11:
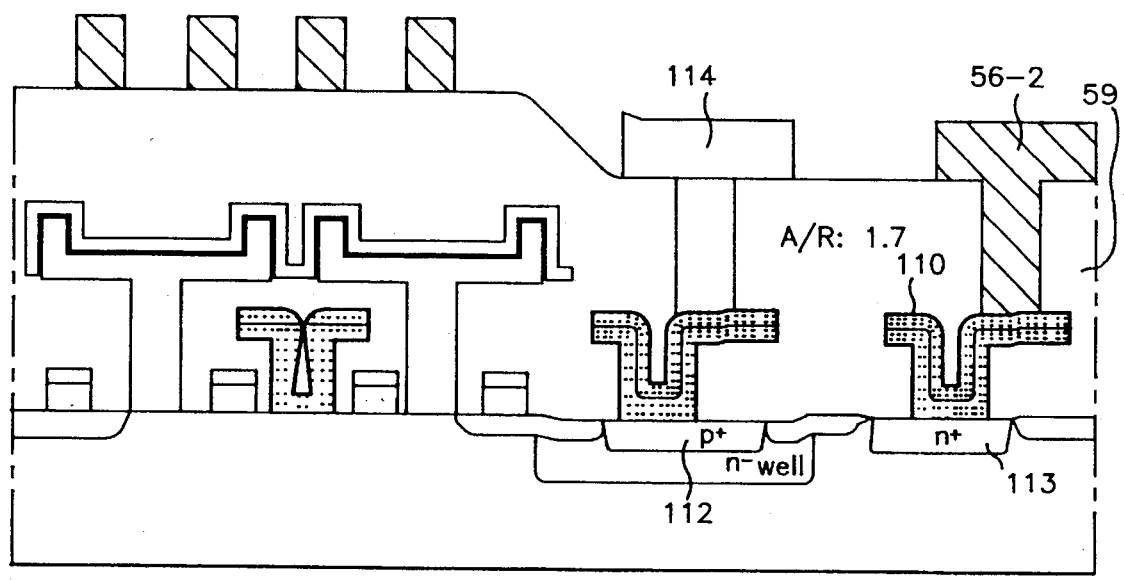
FIG. 11 illustrates a section of a COB structured DRAM element in case the bit line is formed of a metal.

FIG. 11 illustrates a section of a COB-structured DRAM element utilizing the method for forming a bit line of FIGS. 10A to 10E.

As illustrated in FIG. 11, different from the polysilicon film, metal bit line 110 may be formed on all kinds of impurity regions, irrespective of the conduction type of impurity regions 112 and 113.

Figure 3A:
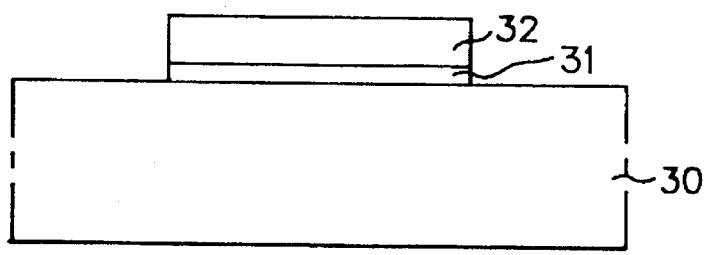
FIG. 3A is a sectional view illustrating a semiconductor element having a gate formed of a conventional titanium nitride film.
Figure 3B:
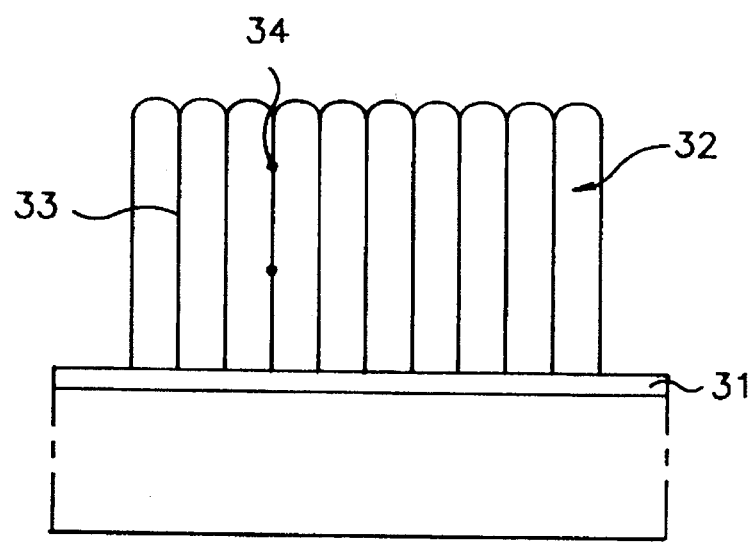
FIG. 3B illustrates the grain structure of the titanium nitride film of FIG. 3A.
Figure 4:
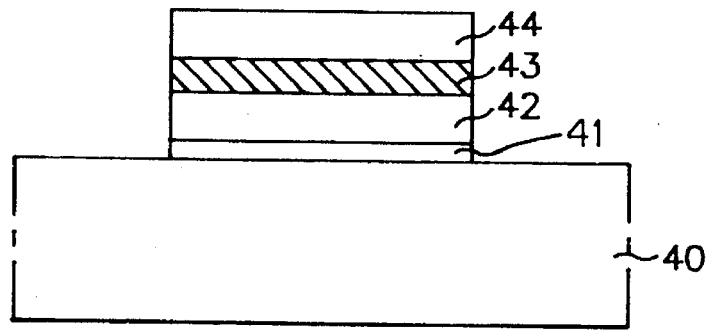
FIG. 4 is a sectional view illustrating a semiconductor element having a gate formed of a conventional composite polycide.
Figure 5:
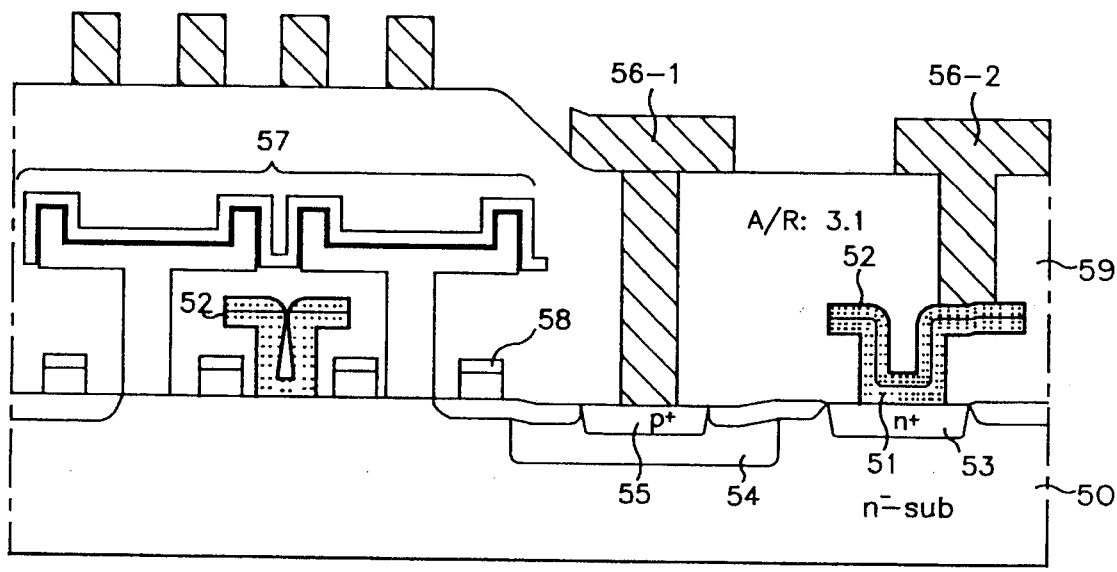
FIG. 5 is a sectional view illustrating a COB DRAM element having a bit line formed of a polycide.

Comparing FIG. 5 and FIG. 11, in case a bit line is formed of a metal as with this invention, since the aspect ratio of a contact formed for following wiring process may be smaller by ½, the following processes become much easier. Since the titanium silicide formed at the bit line contact forms an ohmic contact, the contact resistance can be reduced as compared with the case in which the bit line is formed of a polysilicon film.

This invention as explained above can provide a titanium nitride film having an excellent thermal stability, a low resistivity, and a fine structure by a nitridation process using a heat treatment process. Therefore, since the fine titanium nitride film, serving as an excellent barrier, prevents the bit line metal from diffusing, a DRAM element having excellent properties may be fabricated. In case the fine titanium nitride film is used as an MOS transistor gate, the gate may satisfy the thermal stability of a polysilicon as well as the low resistivity of a silicide.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming a titanium nitride film comprising the steps of:
   forming an oxide film on a semiconductor substrate;
   forming a first titanium nitride film having grain boundaries on the oxide film;
   introducing oxygen into the grain boundaries of the first titanium nitride film, wherein the oxygen is introduced into the grain boundaries by exposing the first titanium nitride film to atmosphere;
   forming a titanium film on the first titanium nitride film; and
   convening the titanium film into a second titanium nitride film.

2. The method of claim 1, wherein the step of converting the titanium film to the second titanium nitride film comprises thermal annealing of the titanium film.

3. The method of claim 1, wherein the first titanium nitride film has columnar structured grain boundaries and is formed by a reactive sputtering method.

4. The method of claim 1, wherein the titanium film is subjected to one to three times of thermal annealing to convert the titanium film into the second titanium nitride film.

5. The method of claim 4, wherein the thermal annealing is performed at about 500° C. for about 40 seconds and at about 800° C. for about 30 seconds.

6. The method of claim 1, wherein the step of converting the titanium film into the second titanium nitride film comprises thermal annealing under an $N_2$ or $NH_3$ atmosphere.

7. The method of claim 1, wherein the step for convening the titanium film into the second titanium nitride film comprises nitridation of the titanium film.

8. The method of claim 7, wherein the amount of nitrogen atoms contained in the converted titanium film is below about 40%.

9. The method of claim 1, wherein the thickness of the titanium film is about 200 to 2000 Å.

10. The method of claim 1, wherein the thickness of the titanium film is about 50 to 500 Å.

11. The method of claim 1, wherein the first titanium nitride film under the titanium film serves as a barrier for inhibiting reaction of the titanium film with the substrate.

12. A method for fabricating a semiconductor element comprising the steps of:
   forming a gate oxide film on a semiconductor substrate of a first conductivity type;
   forming a polysilicon film on the gate oxide film;
   forming a first titanium nitride film having grain boundaries on the polysilicon film;
   introducing oxygen into the grain boundaries of the first titanium nitride film, wherein the oxygen is introduced into the grain boundaries by exposing the first titanium nitride film to atmosphere;
   forming a titanium film on the first titanium nitride film;
   converting the titanium film into a second titanium nitride film;
   forming a gate by patterning the first titanium nitride film and the second titanium nitride film; and
   forming impurity regions in the substrate by injecting second conductivity type impurities into the substrate with the gate used as a mask.

13. The method of claim 12, wherein the step of converting the titanium film into the second titanium nitride film comprises thermal annealing of the titanium film.

14. A method for fabricating a semiconductor element comprising the steps of:
   forming a second conductivity type impurity region in a first conductivity type semiconductor substrate;
   forming an insulation film on the semiconductor substrate;
   forming a contact hole to the impurity region by removing a portion of the insulation film on the impurity region;
   forming a first titanium film having grain boundaries on the insulation film and the impurity region and introducing oxygen into the grain boundaries of the first titanium film, wherein the oxygen is introduced into the grain boundaries by exposing the first titanium nitride film to atmosphere;
   forming a first titanium nitride film having grain boundaries on the first titanium film and introducing oxygen into the grain boundaries of the first titanium nitride film;
   forming a second titanium film on the first titanium nitride film;
   converting the second titanium film into a second titanium nitride film by thermal annealing the second titanium film;
   forming a bit line metal layer on the second titanium nitride film;
   forming a bit line contacting the impurity region through the contact hole by patterning the first titanium film, the first titanium nitride film, the second titanium nitride film, and the bit line metal layer; and
   forming a capacitor extending over the bit line.

15. The method of claim 14, wherein the impurity region comprises silicon, and wherein the impurity region and the titanium film react during the thermal annealing step to form a titanium silicide film.

16. The method of claim 14, wherein the bit line metal layer comprises tungsten.

17. The method of claim 14, wherein the bit line metal layer is deposited with a chemical vapor deposition method.

* * * * *